United States Patent
Engel

(10) Patent No.: US 6,714,446 B1
(45) Date of Patent: Mar. 30, 2004

(54) MAGNETOELECTRONICS INFORMATION DEVICE HAVING A COMPOUND MAGNETIC FREE LAYER

(75) Inventor: Bradley N. Engel, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/437,831

(22) Filed: May 13, 2003

(51) Int. Cl.[7] .................................. G11C 11/14
(52) U.S. Cl. ...................... 365/171; 365/173
(58) Field of Search ............... 365/171, 173, 365/158

(56) References Cited

U.S. PATENT DOCUMENTS 5,953,248 A * 9/1999 Chen et al. ............... 365/158
6,169,689 B1 * 1/2001 Naji .......................... 365/173
6,531,723 B1 * 3/2003 Engel et al. ............... 257/200
6,545,906 B1 * 4/2003 Savtchenko et al. ....... 365/158

* cited by examiner

*Primary Examiner*—Anh Phung
(74) *Attorney, Agent, or Firm*—William E. Koch

(57) ABSTRACT

A magnetoelectronics information device is provided that includes two multi-layer structures and a spacer layer interposed between the two multi-layer structures. Each of the multi-layer structures has two magnetic sublayers and a spacer layer interposed between the two magnetic sublayers. The spacer layer interposed between the two magnetic sublayers provides an antiferromagnetic exchange coupling that is quantified by a saturation field. The spacer layer interposed between the two multi-layer structures provides a second antiferromagnetic exchange coupling is quantified by another saturation field that is less than the first saturation field.

19 Claims, 1 Drawing Sheet

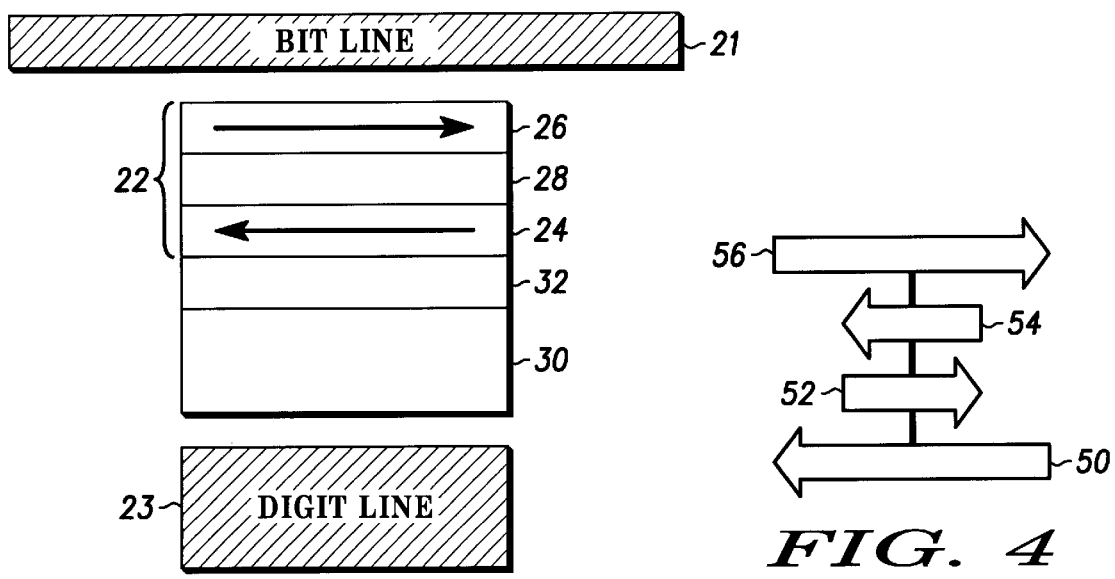
FIG. 1
FIG. 4
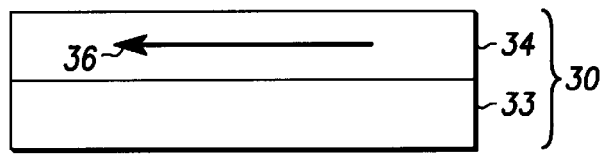
FIG. 2
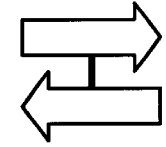
FIG. 5
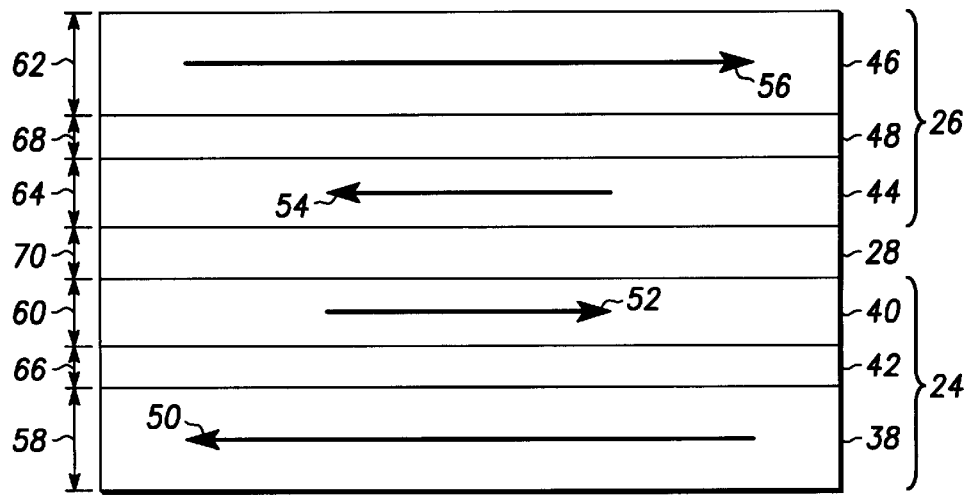
FIG. 3

US 6,714,446 B1

MAGNETOELECTRONICS INFORMATION DEVICE HAVING A COMPOUND MAGNETIC FREE LAYER

FIELD OF THE INVENTION

The present invention generally relates to magnetoelectronics, and more particularly relates to a magnetoelectronics information device having a compound magnetic free layer.

BACKGROUND OF THE INVENTION

Magnetoelectronics, spin electronics and spintronics are synonymous terms for the use of effects predominantly caused by electron spin. Magnetoelectronics is used in numerous information devices, and provides non-volatile, reliable, radiation resistant, and high-density data storage and retrieval. The numerous magnetoelectronics information devices include, but are not limited to, Magnetoresistive Random Access Memory (MRAM), magnetic sensors and read/write heads for disk drives.

Typically, a magnetoelectronics information device, such as a MRAM memory element, has a structure that includes multiple magnetic layers separated by various non-magnetic layers. Information is stored as directions of magnetization vectors in the magnetic layers. Magnetic vectors in one magnetic layer are magnetically fixed or pinned, while the magnetization direction of the other magnetic layer is free to switch between the same and opposite directions that are called "parallel" and "antiparallel" states, respectively. In response to parallel and antiparallel states, the magnetic memory element represents two different resistances. The measured resistance of the magnetic memory element has minimum and maximum values when the magnetization vectors of the two magnetic layers point in substantially the same and opposite directions, respectively. Accordingly, a detection of change in the measured resistance allows a magnetoelectronics information device, such as an MRAM device, to provide information stored in the magnetic memory element.

While gaining wide acceptance as an emerging technology for various memory-related applications, the increased demand for ever smaller memory devices has highlighted some practical design considerations relative to the scalability of magnetoelectronics information devices. While some improvement has been achieved through techniques such as patterning with a higher aspect ratio, the use of a higher aspect ratio also adds a shape component to the anisotropy associated with the memory element. As the anisotropy increases, the amount of current necessary to alter the magnetization direction also increases. Since an increase in the amount of current is generally undesirable or perhaps impractical for certain applications, smaller devices are sought that minimize the corresponding increase in current needed to alter the magnetization direction.

Accordingly, it is desirable to provide a smaller magnetoelectronics information device that minimizes the corresponding increase in current needed to alter the magnetization direction. Furthermore, other desirable features and characteristics of the present invention will become apparent from the subsequent description and the appended claims, taken in conjunction with the accompanying drawings.

BRIEF SUMMARY OF THE INVENTION

A magnetoelectronics information device is provided that includes a first multi-layer structure, a second multi-layer structure, and a third spacer layer interposed between the first multi-layer structure and the second multi-layer structure. The first multi-layer structure a first magnetic sublayer, a second magnetic sublayer a first spacer layer interposed between the first magnetic sublayer and the second magnetic sublayer. The first spacer layer provides a first antiferromagnetic exchange coupling between the first magnetic sublayer and the second magnetic sublayer that is quantified by a first saturation field ($H^1_{sat}$). The second multi-layer structure includes a third magnetic sublayer, a fourth magnetic sublayer and a second spacer layer interposed between the third magnetic sublayer and the fourth magnetic sublayer. The second spacer layer provides: a second antiferromagnetic exchange coupling between the third magnetic sublayer and the fourth magnetic sublayer that is quantified by a second saturation field ($H^2_{sat}$). The third spacer layer interposed between the first multi-layer structure and the second multi-layer structure, the third spacer layer provides a third antiferromagnetic exchange between the first multi-layer structure that is quantified by a third saturation field ($H^3_{sat}$) that is less than the first saturation field ($H^1_{sat}$) and the second saturation field ($H^2_{sat}$).

BRIEF DESCRIPTION OF THE DRAWINGS

The present invention will hereinafter be described in conjunction with the following drawing figures, wherein like numerals denote like elements, and FIG. 1 is an illustration of a magnetoelectronics information device in accordance with an exemplary embodiment of the present invention;

FIG. 2 is an illustration of the pinned magnetic region of the magnetoelectronics information device of FIG. 1 in accordance with an exemplary embodiment of the present invention;

FIG. 3 is an illustration of the free magnetic region of the magnetoelectronics information device of FIG. 1 in accordance with an exemplary embodiment of the present invention; and FIG. 4 is an illustration of the magnetic moments of the free magnetic region of FIG. 3; and FIG. 5 is an illustration of the net difference of the unbalanced magnetic moments of FIG. 4.

DETAILED DESCRIPTION OF THE INVENTION

The following detailed description of the invention is merely exemplary in nature and is not intended to limit the invention or the application and uses of the invention. Furthermore, there is no intention to be bound by any expressed or implied theory presented in the preceding background of the invention or the following detailed description of the invention.

Referring to FIG. 1, a magnetoelectronics information device 20 is shown in accordance with an exemplary embodiment of the present invention. While the magnetoelectronics information device 20 is a Magnetoresistive Random Access Memory (MRAM) element, such as the MRAM element originally described in U.S. Pat. No. 6,545,906B1, entitled "A Method of Writing to a Scalable Magnetoresistance Random Access Memory Element," filed Oct. 16, 2001, naming Leonid Savtchenko as the first named inventor, other magnetoelectronics information devices and other MRAM elements are available in accordance with the present invention, including, but not limited to, magnetic sensors and read/write heads for disk drives. (U.S. Pat. No.

6,545,906B1 is hereby incorporated in its entirety by reference and shall be referred to hereinafter as the Savtchenko Reference.) Furthermore, while a single magnetoelectronics memory device 20 is illustrated and described in this detailed description, magnetoelectronics information devices are typically used in combination.

Generally, the magnetoelectronics information device 20 has a free magnetic region 22 that includes a first multi-layer structure 24, a second multi-layer structure 26 and a spacer layer 28 interposed between the first multi-layer structure 24 and the second multi-layer structure 26 (i.e., a compound magnetic free layer). In addition, the magnetoelectronics information device 20 has a pinned magnetic region 30 and a spacer layer 32 interposed between the free magnetic region 22 and the pinned magnetic region 30. As used herein, a free magnetic region shall mean a magnetic region with a resultant magnetic moment that is free to rotate in the presence of an applied magnetic field and a pinned magnetic region shall mean a magnetic region with a resultant magnetic moment, which does not rotate in the presence of the applied magnetic filed that rotates the resultant magnetic moment of the free magnetic region. For purposes of simplicity and clarity, other layers and structures of the magnetoelectronics information device 20 are not depicted in this FIG. 1. However, those of ordinary skill in the art will recognize that additional layers and structures can be included in the magnetoelectronics information device 20. For example, the pinned magnetic region 30 can be formed on one or more substrate layers (not shown), one or more seed layers (not shown), one or more template layers (not shown), and/or a bit line 21 and a digit line 23 can be formed in proximity to the magnetoelectronics information device 20 as well known to those of ordinary skill in the art.

The pinned magnetic region 30 can have any number of configurations in accordance with the present invention. For example, the pinned magnetic region 30 can be a multi-layer structure, such as the tri-layer structure described and illustrated in the Savtchenko Reference. Alternatively, other multi-layer structures with more than three (3) layers or less than three (3) layers can be used for the pinned magnetic region 30, such as the dual-layer structure as shown in FIG. 2.

Referring to FIG. 2, the dual-layer structure of the pinned magnetic region 30 preferably includes an antiferromagnetic layer 33 and a ferromagnetic layer 34. However, other magnetic materials can be used in accordance with the present invention. The antiferromagnetic layer 33 can be fabricated using any number or suitable antiferromagnetic materials, such as iridium manganese iridium manganese (IrMn), iron manganese (FeMn), rhodium manganese (RhMn), platinum manganese (PtMn), and platinum palladium manganese (PtPdMn). The ferromagnectic layer 34, which is preferably formed on the antiferromagnetic layer 33, can be formed using any number of ferromagnetic materials, such as nickel (Ni), Iron (Fe), manganese (Mn), cobalt (Co) or combinations of these materials (e.g., nickel iron (NiFe), nickel iron cobalt (NiFeCo), or cobalt iron (CoFe)). As can be appreciated by those of ordinary skill of the art, the formation of the ferromagnetic layer 34 on the antiferromagnetic layer 33 provides an exchange coupling between these two layers (33,34) that "pins" or "fixes" a magnetic moment 36 of the ferromagnetic layer 34 in a direction, which can be any number of directions in accordance with the present invention. As known to those of ordinary skill in the art, the pinned or fixed magnetic moment 36 of the ferromagnetic layer 34 provides a reference magnetic moment and the relative orientation of the reference magnetic moment and the magnetic moment of the free magnetic region adjacent to the spacer layer 32 governs the tunneling magnetoresistance, which affects current flow through the magnetoelectronics information device 20 as shown in FIG. 1.

Referring to FIG. 1, the spacer layer 32, which is also commonly referred to as a tunneling barrier, is preferably formed on the pinned magnetic region 30. As known to those of ordinary skill in the art, one or more materials forming the spacer layer 32 are selected according to the type of magnetoelectronics information device 20. For example, the spacer layer 32 is preferably formed with a dielectric material, such as aluminum oxide ($Al_2O_3$) or Aluminum Nitride (AlN), for a Magnetic Tunnel Junction (MTJ), and the spacer layer 32 is preferably formed with a conductive material, such as copper (Cu), for a Giant Magnetic Resistance (GMR) a spin valve structure. However, other materials and/or combination of materials can be used in accordance with the present invention to separate the pinned magnetic region 30 and the free magnetic region 22.

Referring to FIG. 3, the free magnetic region 22 of the magnetoelectronics information device 20 of FIG. 1 is shown in accordance with an exemplary embodiment of the present invention. As previously described in this detailed description of the invention, the free magnetic region 22 includes the first multi-layer structure 24, the second multi-layer structure 26 and the spacer layer 28 interposed between the first multi-layer structure 24 and the second multi-layer structure 26. The first multi-layer structure 24 preferably includes magnetic sublayers (38,40) and a spacer layer 42 and the second multi-layer structure 26 preferably include magnetic sublayers (44,46) and a spacer layer 48. However, the free magnetic region 22 can be formed with more than the two multi-layer structures (24,26) and more than the one spacer layer 28, the first multi-layer structures 24 can be formed with layers in addition to the two magnetic sublayers (38,40) and the spacer layer 42 and the second multi-layer structures 26 can be formed with layers in addition to the two magnetic sublayers (44,46) and the spacer layer 48.

In accordance with an exemplary embodiment of the present invention, the first multi-layer structure 24 and/or the second multi-layer structure 26 are synthetic ferrimagnetic structures. Therefore, the magnetic layers (38,40,44, 46) are preferably ferromagnetic layers. In addition, the spacer layers (42,48) between the magnetic layers (38,40, 44,46) and the spacer layer 28 between the first multi-layer structure 24 and the second multi-layer structure 26 are preferably antiferromagnetic coupling layers that provide antiparallel exchange couplings. The antiferromagnetic coupling layers providing the antiparallel exchange couplings of the free magnetic region 22 can be formed of any number of materials such as ruthenium (Ru), osmium(Os), rhenium (Re), chromium (Cr), rhodium (Rh), copper (Cu) or combinations thereof that display oscillatory exchange coupling with first order and second order antiferromagnetic peaks at particular spacer thicknesses. The ferromagnetic layers forming the magnetic layers (38,40,44,46) can be formed using alloys formed of combinations of cobalt (Co), iron (Fe) and nickel (Ni), such as nickel iron (NiFe).

The free magnetic region 22 is configured such that the spacer layer 42 between the magnetic layers (38,40) of the first multi-layer structure 24 and the spacer layer 48 between the magnetic layers (44,46) of the second multi-layer structure 26 provide a strong antiferromagnetic exchange coupling between the magnetic layers (38,40) of the first multi-layer structure 24 and the magnetic layers (44,46) of the second multi-layer structure 26 that can be quantified by a first saturation field ($H^1_{sat}$) and a second saturation field ($H^2_{sat}$), respectively, which are the fields that saturate the moments of the magnetic layers of each of the multi-layer structures parallel to each other. In addition, the spacer layer 28 between the first multi-layer structure 24 and the second multi-layer structure 26 is configured such that an antiferromagnetic exchange coupling exists between the first multi-layer structure 24 and the second multi-layer structure 26 that is weaker than the exchange coupling between the magnetic layers (38,40) of the first multi-layer structure 24 and the magnetic layers (44,46) of the second multi-layer structure 26 that is quantified by a third saturation field ($H^3_{sat}$), which is the field that saturates the net moment of the multi-layer structure 24 parallel to the net moment of the multi-layer structure 26. Therefore, the third saturation field ($H^3_{sat}$) is less than the first saturation field ($H^1_{sat}$) and the second saturation field ($H^2_{sat}$). In accordance with one exemplary embodiment of the present invention, the exchange coupling provided by the spacer layer 28 between the first multi-layer structure 24 and the second multi-layer structure 26 is a second order exchange coupling and the exchange couplings between the magnetic layers (38,40,44, 46) of the first multi-layer structure 24 and second multi-layer structure 26 are first order exchange couplings.

This exchange coupled structure of the free magnetic region 22 as previously described in this detailed description of the invention is configured to exhibit a net magnetic moment derived from magnetic moments (50,52,54,56) of the magnetic sublayers (38,40,44,46). Generally, one magnetic sublayer 38 of the first multi-layer structure 24 is configured with a first magnetic moment 50 having a first magnitude in a first direction and the other magnetic sublayer 40 of the first multi-layer structure 24 is configured with a second magnetic moment 52 having a second magnitude that is less than the first, magnitude and a second direction that is a direction other than the first direction. Preferably, the second direction is approximately opposite the first direction (i.e., a direction that is rotated about one hundred and eighty degrees (180°)). However, the magnetic sublayers (38,40) of the first multi-layer structure 24 can have other directions in accordance with the present invention.

Similarly, one magnetic sublayer 46 of the second multi-layer structure 26 is configured with a first magnetic moment 56 having a first magnitude in a first direction and the other magnetic sublayer 44 of the second multi-layer structure 26 is configured with a second magnetic moment 54 having a second magnitude that is less than the first magnitude and a second direction other than the first direction. Preferably, the second direction is approximately opposite the first direction. However, the magnetic sublayers (44,46) of the second multi-layer structure 26 can have other directions in accordance with the present invention.

The relative magnitudes for the magnetic moments (50, 52,54,56) of the magnetic sublayers (38,40,44,46), the strength of the exchange coupling between the first multi-layer structure 24 and the second multi-layer structure 26 and the strength of the exchange coupling between the magnetic sublayers (38,40,44,46) of the first multi-layer structure 24 and the second multi-layer structure 26 are preferably provided with variations in the thicknesses (58, 60,62,64) of the magnetic sublayers (38,40,44,46) and variations in the thicknesses (66,68,70) of the spacer layers (28,42,48). More specifically, and by way of example, the one magnetic sublayer 38 of the first multi-layer structure 24 is formed with a first thickness 58 that is greater than a second thickness 60 of the other magnetic sublayer 40 of the first multi-layer structure 24 such that the magnetic moment magnitude of the one magnetic sublayer 38 is greater than the magnetic moment magnitude of the other magnetic sublayer 40. In addition, the one magnetic sublayer 46 of the second multi-layer structure 26 is formed with a first thickness 62 that is greater than a second thickness 64 of the other magnetic sublayer 44 of the second multi-layer structure 26 such that the magnetic moment magnitude of the one magnetic sublayer 46 is greater than the magnetic moment magnitude of the other magnetic sublayer 44. Furthermore, the thickness 70 of the spacer layer 28 between the first multi-layer structure 24 and the second multi-layer structure 26 is greater than the thickness 66 of the spacer layer 42 between the magnetic sublayers (38,40) of the first multi-layer structure 24 and the thickness 68 between the magnetic sublayers (44,46) of the second multi-layer structure 26.

For example, the spacer layers (42,48) between the magnetic sublayers (38,40,44,46) can be formed of ruthenium (Ru) with thicknesses (66,68) of approximately six to ten Angstroms (i.e., 6–10 Å) and the spacer layer 28 between the first multi-layer structure 24 and the second multi-layer structure 26 can be formed of ruthenium (Ru) with thickness 68 of approximately sixteen to twenty-one Angstroms (i.e., 16–21 Å). In this example, the first thickness 58 of the one magnetic sublayer 38 of the first multi-layer structure 24 and the first thickness 62 of the one magnetic sublayer 46 of the second multi-layer structure 26 is approximately forty to fifty Angstroms (i.e., 40–50 Å) and the thickness 60 of the other magnetic sublayer 40 of the first multi-layer structure 24 and the other thickness 64 of the other magnetic sublayer 44 of the second multi-layer structure 26 is approximately thirty Angstroms (30 Å).

As shown in FIG. 4, the structure of the free magnetic region provides a strong exchange coupling (e.g., an antiferromagnetic exchange coupling) between the magnetic moments (54,56) of the first multi-layer structure, a strong exchange coupling between the magnetic moments (50,52) of the second multi-layer structure, and a relatively weaker exchange coupling between the first multi-layer structure and the second multi-layer structure. In this manner, each of the multi-layer structures exhibits the characteristics of a single layer material with a lower net magnetic moment that is the net difference of the unbalanced magnetic moments in each multi-layer structure as shown in FIG. 5. With continuing reference to FIG. 4, the combination of the magnetic moments (50,52,54,56) and the exchange coupling associated with the magnetic sublayers results in a balanced compound free layer (e.g., a synthetic antiferromagnetic (SAF) free layer) that exhibits a low effective magnetic moment with a relatively weaker exchange between the two multi-layer structures and can act as a single free-layer, such as the free-layer in the Savtchenko Reference. The lower effective magnetic moment reduces the effects due to shape anisotropy and the total volume of the magnetic memory elements can be increased while minimizing, to the extent possible, the increase in the magnetic switching field.

As can be appreciated by those of ordinary skill in the art, the configuration of the free magnetic region of the present invention provides numerous benefits. For example, the various multi-layer structures, magnetic sublayers and spacer layers combine to form free magnetic region with a magnetic moment less than that of prior art tri-layer SAF free layers. This allows the production of magnetoelectronics information devices that are scaled at smaller dimensions without significantly increasing the amount of current used to toggle the magnetic state of the magnetoelectronics information devices.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A magnetoelectronics information device, comprising:
    a first multi-layer structure, said first multi-layer structure comprising:
        a first magnetic sublayer;
        a second magnetic sublayer; and
        a first spacer layer interposed between said first magnetic sublayer and said second magnetic sublayer, said first spacer layer providing a first antiferromagnetic exchange coupling between said first magnetic sublayer and said second magnetic sublayer that is quantified by a first saturation field ($H^1_{sat}$);
    a second multi-layer structure, said second multi-layer structure comprising:
        a third magnetic sublayer;
        a fourth magnetic sublayer; and
        a second spacer layer interposed between said third magnetic sublayer and said fourth magnetic sublayer, said second spacer layer providing a second exchange antiferromagnetic coupling between said third magnetic sublayer and said fourth magnetic sublayer that is quantified by a second saturation field ($H^2_{sat}$); and
    a third spacer layer interposed between said first multi-layer structure and said second multi-layer structure, said third spacer layer providing a third antiferromagnetic exchange between said first multi-layer structure that is quantified by a third saturation field ($H^3_{sat}$) that is less than said first saturation field ($H^1_{sat}$) and said second saturation field ($H^2_{sat}$).

2. The magnetoelectronics information device of claim 1, wherein said first antiferromagnetic exchange coupling is about a first order exchange coupling.

3. The magnetoelectronics information device of claim 1, wherein said second antiferromagnetic exchange coupling is about a first order exchange coupling.

4. The magnetoelectronics information device of claim 1, wherein said third antiferromagnetic exchange coupling is about a second order exchange coupling.

5. The magnetoelectronics information device of claim 1, further comprising a pinned magnetic region and a fourth spacer layer interposed between said pinned magnetic region and said fourth magnetic sublayer.

6. The magnetoelectronics information device of claim 5, wherein said fourth spacer layer is a dielectric.

7. The magnetoelectronics information device of claim 5, wherein said fourth spacer layer is a conductor.

8. The magnetoelectronics information device of claim 1, wherein said pinned magnetic region comprises an antiferromagnetic layer and a ferromagnetic layer.

9. The magnetoelectronics information device of claim 6, wherein said antiferromagnetic layer is at least partially formed of one material selected from the group comprising iridium manganese iridium manganese (IrMn), iron manganese (FeMn), rhodium manganese (RhMn), platinum manganese (PtMn), and platinum palladium manganese (PtPdMn).

10. The magnetoelectronics information device of claim 6, wherein said ferromagnetic layer is at least partially formed of one material selected from the group comprising nickel (Ni), Iron (Fe), manganese (Mn), cobalt (Co).

11. The magnetoelectronics information device of claim 1, wherein said first magnetic sublayer, said second magnetic sublayer, said third magnetic sublayer and said fourth magnetic sublayer is a ferromagnetic layer.

12. The magnetoelectronics information device of claim 1, wherein said ferromagnetic layer is formed using alloys formed of combinations of cobalt (Co), iron (Fe) and nickel (Ni).

13. The magnetoelectronics information device of claim 6, wherein said first spacer layer and said second spacer layer is at least partially formed of one material selected from the group comprising ruthenium (Ru), osmium(Os), rhenium (Re), chromium (Cr), rhodium (Rh), copper (Cu).

14. The magnetoelectronics information device of claim 1, wherein said magnetoelectronics information device is a Magnetoresistive Random Access Memory (MRAM) element.

15. A free magnetic region of a Magnetoelectronic Random Access Memory (MRAM) element, comprising:
    a first synthetic ferrimagnetic structures, said first synthetic ferrimagnetic sublayer comprising:
        a first ferromagnetic sublayer;
        a second ferromagnetic sublayer; and
        a first anti-parallel exchange coupling spacer layer interposed between said first ferromagnetic sublayer and said second ferromagnetic sublayer, said first anti-parallel exchange coupling spacer layer providing a first antiparallel exchange coupling between said first ferromagnetic sublayer and said second ferromagnetic sublayer that is quantified by a first saturation field ($H^1_{sat}$);
    a second synthetic ferrimagnetic free sublayer, said second synthetic ferrimagnetic free sublayer comprising:
        a third ferromagnetic sublayer;
        a fourth ferromagnetic sublayer; and
        a second anti-parallel exchange coupling spacer layer interposed between said third ferromagnetic sublayer and said fourth ferromagnetic sublayer, said second anti-parallel exchange coupling spacer layer providing a second antiparallel exchange coupling between said third ferromagnetic sublayer and said fourth ferromagnetic sublayer that is quantified by a second saturation field ($H^2_{sat}$); and
    a third antiparallel exchange coupling spacer layer interposed between said first synthetic ferrimagnetic free sublayer and said second synthetic ferrimagnetic free sublayer, said third antiparallel exchange coupling spacer layer providing a third anti-parallel exchange coupling between said first synthetic ferrimagnetic free sublayer and said second synthetic ferrimagnetic sublayer that is quantified by a third saturation field ($H^3_{sat}$) that is less than said first saturation field ($H^1_{sat}$) and said second saturation field ($H^2_{sat}$).

16. The magnetoelectronics information device of claim 15, wherein said first antiparallel exchange coupling is about a first order antiferromagnetic exchange coupling.

17. The magnetoelectronics information device of claim 15, wherein said second antiparallel exchange coupling is about a first order antiferromagnetic exchange coupling.

18. The magnetoelectronics information device of claim 15, wherein said third antiparallel exchange coupling is about a second order exchange coupling.

19. A free magnetic region of a Magnetoelectronic Random Access Memory (MRAM) element, comprising:
   a first synthetic ferrimagnetic structures, said first synthetic ferrimagnetic sublayer comprising:
      a first ferromagnetic sublayer;
      a second ferromagnetic sublayer; and
      a first anti-parallel exchange coupling spacer layer interposed between said first ferromagnetic sublayer and said second ferromagnetic sublayer, said first anti-parallel exchange coupling spacer layer providing a first antiparallel exchange coupling between said first ferromagnetic sublayer and said second ferromagnetic sublayer that is quantified by a first saturation field ($H^1_{sat}$);
   a second synthetic ferrimagnetic free sublayer, said second synthetic ferrimagnetic free sublayer comprising:
      a third ferromagnetic sublayer;
      a fourth ferromagnetic sublayer; and
      a second anti-parallel exchange coupling spacer layer interposed between said third ferromagnetic sublayer and said fourth ferromagnetic sublayer, said second anti-parallel exchange coupling spacer layer providing a second antiparallel exchange coupling between said third ferromagnetic sublayer and said fourth ferromagnetic sublayer that is quantified by a second saturation field ($H^2_{sat}$);
   a third antiparallel exchange coupling spacer layer interposed between said first synthetic ferrimagnetic free sublayer and said second synthetic ferrimagnetic free sublayer, said third antiparallel exchange coupling spacer layer providing a third anti-parallel exchange coupling between said first synthetic ferrimagnetic free sublayer and said second synthetic ferrimagnetic sublayer that is quantified by a third saturation field ($H^3_{sat}$) that is less than said first saturation field ($H^1_{sat}$) and said second saturation field ($H^2_{sat}$); and
   a pinned magnetic region.

* * * * *